United States Patent
Lim et al.

(10) Patent No.: US 6,454,563 B1
(45) Date of Patent: Sep. 24, 2002

(54) WAFER TREATMENT CHAMBER HAVING THERMAL REFLECTOR

(75) Inventors: Jung-Su Lim, Suwon; Kang-Wook Moon, Seoul; Yong-Woon Son, Suwon; Heung-Ahn Kwon, Yongin, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/847,287

(22) Filed: May 3, 2001

(30) Foreign Application Priority Data

Aug. 17, 2000 (KR) .......................... 2000-47386

(51) Int. Cl.[7] .................................. F27B 5/04
(52) U.S. Cl. ................... 432/200; 432/205; 432/258; 219/405; 392/418; 118/725
(58) Field of Search .................. 432/81, 200, 203, 432/205, 253, 258; 219/390, 405; 392/416, 418; 118/50.1, 724, 725

(56) References Cited

U.S. PATENT DOCUMENTS 6,025,575 A * 2/2000 Park et al. ................. 118/725
6,107,192 A * 8/2000 Subrahmanyan et al. ... 438/637
6,301,434 B1 * 10/2001 McDiarmid et al. ........ 392/416
6,311,638 B1 * 11/2001 Ishii et al. .......... 118/723 MW \* cited by examiner Primary Examiner—Gregory Wilson
(74) Attorney, Agent, or Firm—Volentine Francos, PLLC

(57) ABSTRACT

A wafer treatment apparatus includes a wafer heating device having a wafer-load region at an upper portion, a shower head opposing the wafer-load region for ejecting/directing a source gas toward the wafer surface, and a reflecting apparatus positioned between the shower head and the heating device for reflecting thermal energy radiated from the heating device back toward the wafer-load region. The reflecting apparatus includes a reflector positioned above and opposing the wafer-load region, and a supporter for supporting the reflector. The reflector may have a flattened reflecting surface facing toward the wafer-load region, or may be a semi-spherical type reflector having a concave mirror facing toward the wafer-load region. The reflector can be controlled to move vertically relative to the wafer.

15 Claims, 5 Drawing Sheets

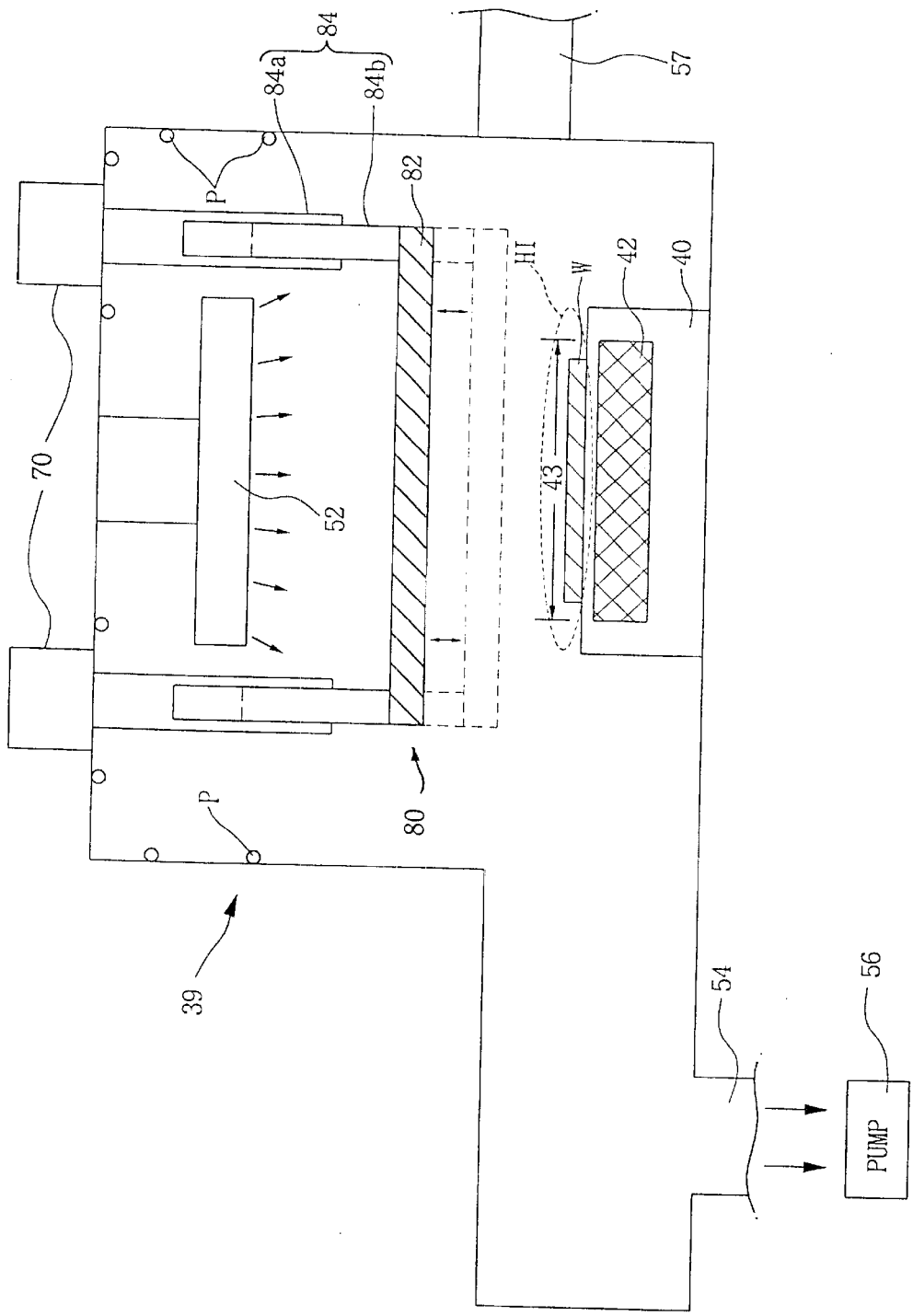

WAFER TREATMENT CHAMBER HAVING THERMAL REFLECTOR

BACKGROUND OF THE INVENTION

1. Field of the Invention

The present invention relates to an apparatus for treating semiconductor wafers, and more particularly, the present invention relates to an apparatus for treating a wafer in which a thermal reflector is provided above a wafer support.

2. Description of the Related Art

Thin films comprised of various types of materials are formed on wafers during the sequential processes for manufacturing a semiconductor device. To ensure high yields and operationally superior devices, the thin film materials should exhibit good step coverage, that is, a uniform thickness over every region, regardless of the surface pattern of an underlying layer.

Uniform step coverage requires that all process conditions employed in the formation of thin films be uniformly maintained, from source gas supply to wafer temperature. Moreover, the structure of the thin film forming apparatus itself may affect the uniformity of the thin film.

FIG. 1 is a cross sectional schematic view of a conventional thin film forming apparatus. The conventional apparatus includes a chamber 10 for housing the wafers to isolate them from the outside environment during a process of forming thin films. The apparatus also includes a susceptor 16 formed on the bottom surface of the chamber 10, and a shower head 18. The susceptor 16 supports the wafer 24 along a wafer-load region 20, and a heater 22 is provided under the wafer-load region 20. The heater 22 maintains the wafer 24 at a preferred temperature conducive to the formation of a thin film on the wafer 24. In addition, the heater 22 may be used to anneal the wafer 24 after forming the thin film thereon.

The shower head 18 directs the source gas, which is needed to form the thin film material, toward the wafer 24 on the wafer load region 20. Any residual gases are discharged through an outlet 28 formed at the bottom of the chamber 10 by a pump 26 provided outside of the chamber 10. Inlet/outlet region 30 allows the wafer 24 to be transported into and out of the chamber 10.

With the conventional thin film forming apparatus, by-products are created during the process and these by-products adhere to the chamber wall and aggregate to become particles 32. In addition, if a multi-chamber apparatus is used, when the wafer is transferred within the confines of the multi-chamber apparatus, the by-products or the thin film materials which exist near the wafer-load region of the susceptor may also be transferred.

Accordingly, with the conventional film forming apparatus, particles 32 adhered to the chamber wall may break apart and be deposited on the wafer, or by-products created by transfer of the wafer may be adhered to the wafer, resulting in undesirable impurities being included on the thin film deposited on the wafer. This degrades the thin film characteristics, and ultimately degrades the semiconductor device function when the inferior thin film is applied on the semiconductor device.

Another problem with the conventional apparatus concerns the heating/annealing of the wafer. After the thin film material is formed on the wafer, an annealing step to stabilize the thin film is performed at a temperature higher than that used for forming the thin film. The wafer temperature is a function of the thermal energy supplied from a heater block (e.g., 22 in FIG. 1), but the thermal energy distribution is not uniform when the heater block is initially heating up. Accordingly, the temperature distribution along the wafer is not uniform. When the temperature of the wafer is increased by using the heater, the temperature only stabilizes after oscillating above and below the preferred temperature. Thus it takes time to obtain a uniform temperature distribution along a wafer during the annealing process, which reduces the throughput.

SUMMARY OF THE INVENTION

Accordingly, it is an object of the present invention to provide an apparatus for surface treatment of a wafer which prevents impure particles from being deposited onto the wafer, especially during the formation of a thin film.

It is another object of the present invention to quickly obtain a uniform wafer-temperature distribution during an annealing process after the formation of a thin film, thereby improving the performance and increasing the productivity of semiconductor devices.

To achieve these and other objects, the present invention provides a wafer heating device having a wafer-load region at an upper portion, a shower head opposing the wafer-load region for ejecting/directing a source gas toward the wafer surface, and a reflecting apparatus positioned between the shower head and the heating device for reflecting thermal energy radiated from the heating device back toward the wafer-load region. There is also provided a pumping device for controlling the air pressure in the chamber and for discharging by-products formed within the chamber.

The reflecting apparatus includes a reflector positioned above and opposing the wafer-load region, and a supporter for supporting the reflector. The reflector may have a flattened reflecting surface facing toward the wafer-load region, or a semi-spherical type reflector having a concave mirror facing toward the wafer-load region.

The reflector can be controlled to move upward and downward in response to the thin film formation process and the annealing process. The movable reflector is connected via the supporter to a driver outside the chamber. The supporter includes a first cylinder connected to the driver and a second cylinder connected to the driver through the first cylinder at one end, and connected to the reflector at the other end. The supporter is symmetrically arranged around the shower head or the heating device.

The thin film forming apparatus according to the present invention is provided therein with a reflecting apparatus above the susceptor, thereby preventing particles from being deposited on the wafer during the formation of the thin film. In addition, even without applying additional power to the heater during the thin film forming process to the annealing process, the wafer temperature can be increased and stabilized in preparation for the annealing, and is uniformly maintained. Furthermore, even if additional temperature controls are necessary, the reflector shortens the time required to reached a stabilized increased temperature, thereby increasing the productivity of the semiconductor device manufacturing process.

BRIEF DESCRIPTION OF THE DRAWINGS

The objects and advantages of the present invention will become better understood the following detailed description that follows, with reference to the accompanying drawings, in which:

FIG. 6 is a cross sectional schematic view of a thin film forming apparatus according to a second embodiment of the present invention.

DETAILED DESCRIPTION OF THE PREFERRED EMBODIMENTS

Figure 1:
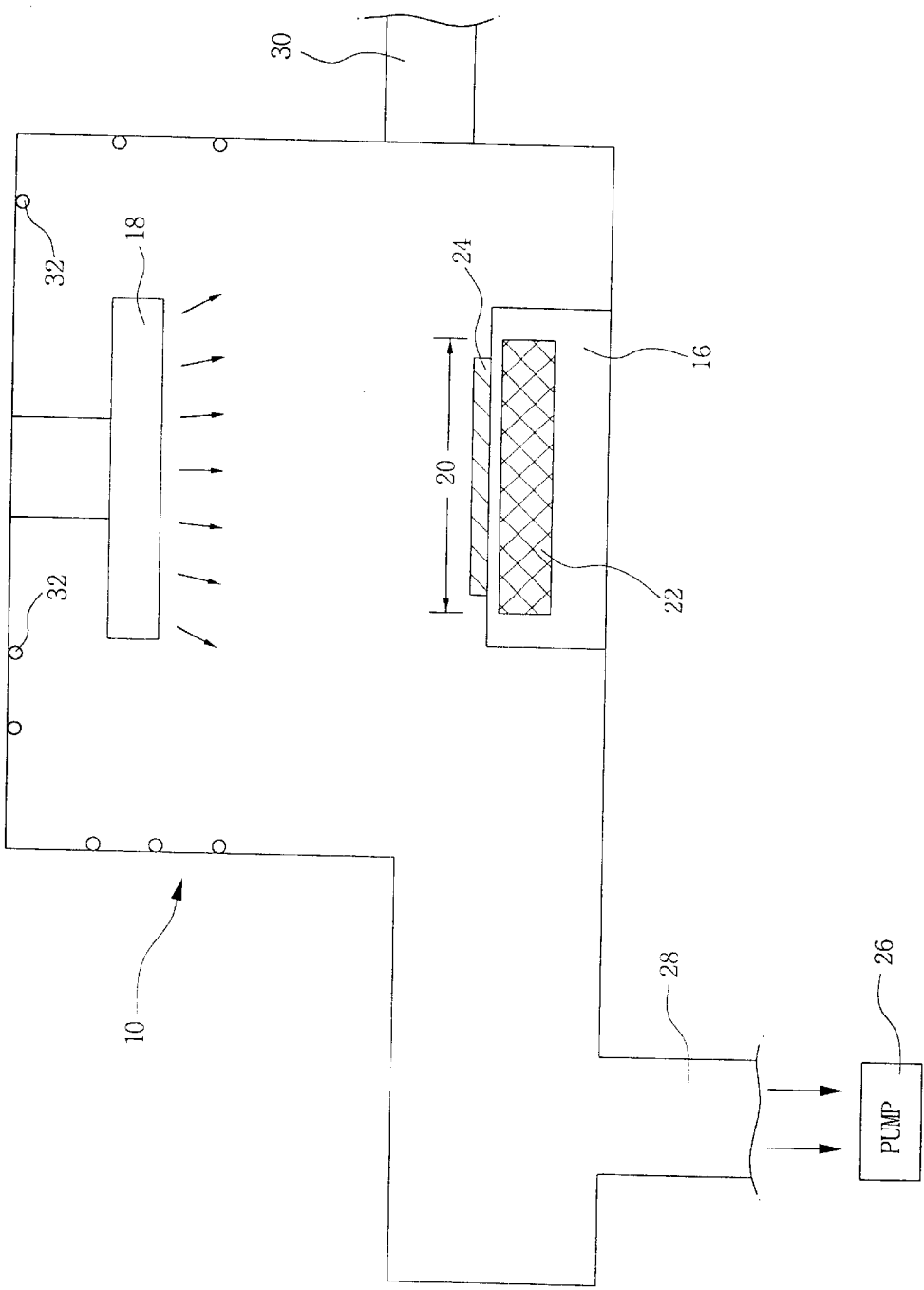
FIG. 1 is a cross sectional schematic view of a conventional thin film forming apparatus.

The preferred embodiment of the present invention will now be described in detail with reference to the accompanying drawings. Throughout the drawings, like reference numerals and nomenclature designate like or equivalent parts. In the drawings, layers or thicknesses in various regions may be exaggerated for clarity.

<First Embodiment>

Figure 2:
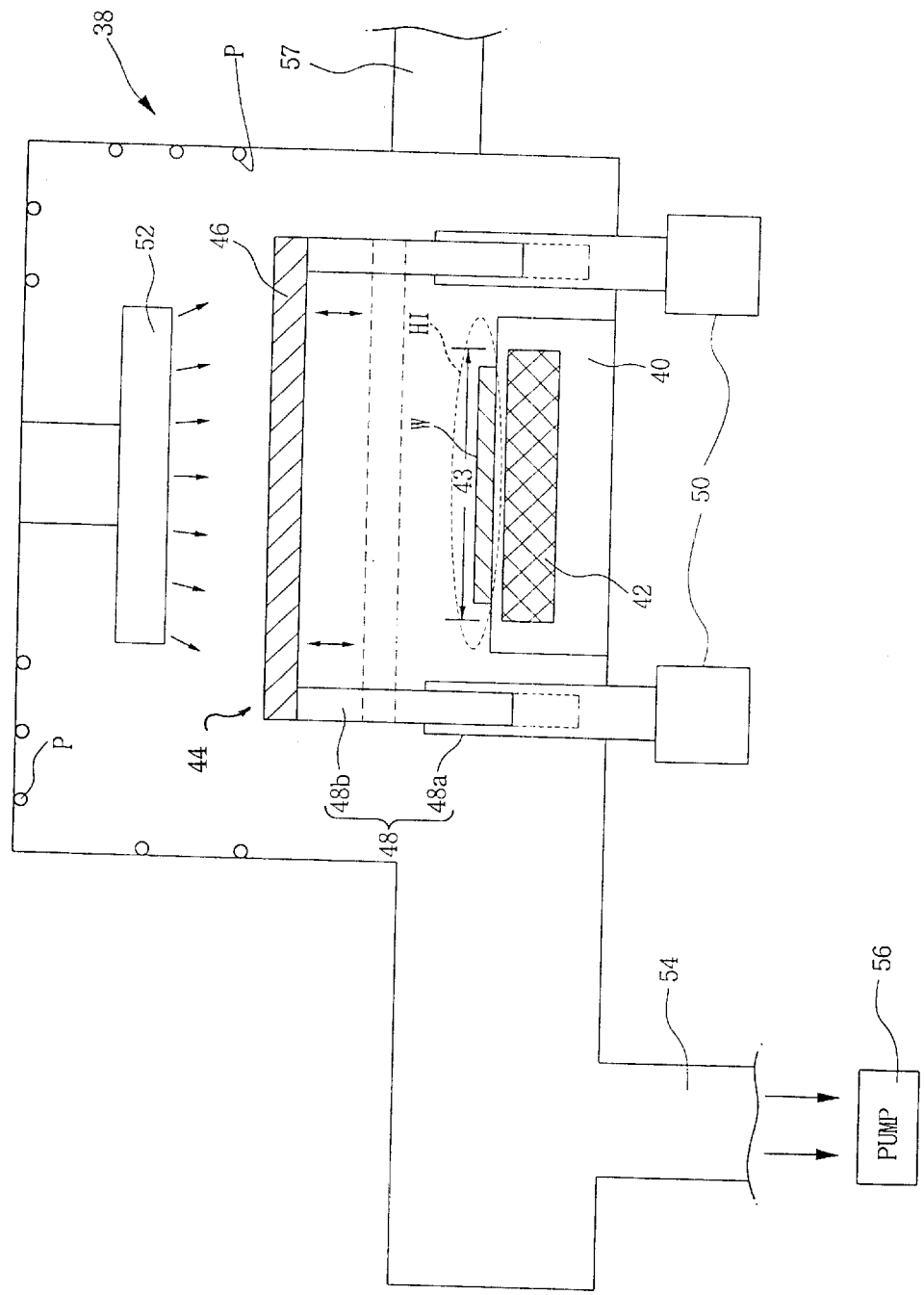
FIG. 2 is a cross sectional schematic view of a thin film forming apparatus according to a first embodiment of the present invention.

Referring to FIG. 2, a heating apparatus 40 is located in the lower portion of the chamber 38. A wafer-load region 43 for supporting a wafer (W) is provided on the upper portion of the heating apparatus 40. After loading the wafer (W) in the chamber, the heating apparatus 40 enables the wafer (W) to be heated to a temperature appropriate for formation of a thin film on the wafer (W). After the wafer temperature for forming the thin film is stabilized, the heating apparatus 40 serves to maintain the wafer at the stabilized temperature until the thin film is formed on the wafer (W). In addition, the heating apparatus 40 can be used in the wafer-annealing process for stabilizing the thin film after the thin film material is formed on the wafer (W). That is, the heating apparatus 40 may be used to increase the wafer temperature to a stabilized temperature appropriate to the annealing temperature, and can also be used to maintain the stabilized temperature until the annealing process is completed.

A heater 42 is disposed below the wafer (W) and housed in the upper portion of the heating apparatus 40, and supplies thermal energy to the wafer. A typical heater 42 includes a number of heater blocks, and the portion of the wafer in contact with the heater block is heated first, which causes a nonuniform temperature distribution in the wafer.

In the present invention, however, a reflecting apparatus 44 is disposed above the wafer-load region 43. The reflecting apparatus 44 reflects thermal energy radiated from the heater 42 back toward the wafer-load region 43. Therefore, the entire surface of the wafer (W) at the wafer-load region 43 is uniformly heated due to this additional heating mechanism deployed in the chamber. A so-called "heat island" (HI) is thus formed by the reflecting apparatus 44, which provides a uniform distribution of thermal energy on the wafer-load region 43, both during the thin film forming and annealing processes, thereby resulting in a thin film material with uniform thickness and good characteristics being formed on the wafer (W).

Figure 3:
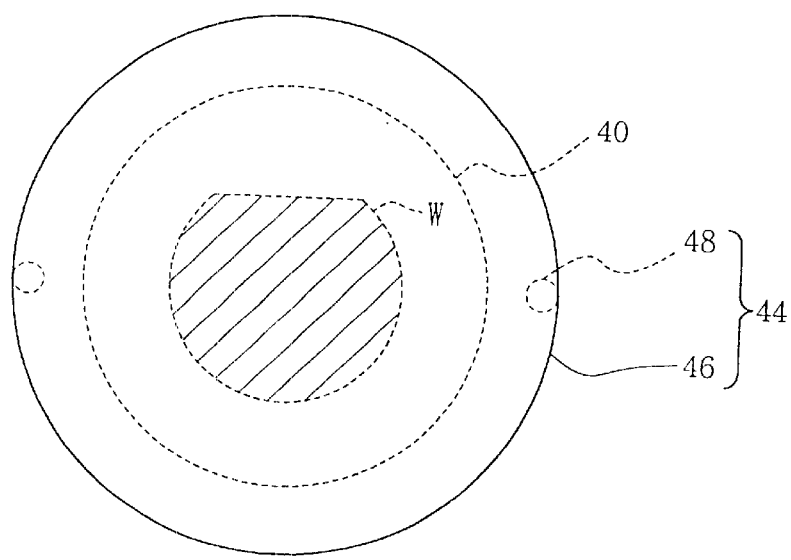
FIGS. 3 and 4 are plan views of a reflecting apparatus provided in the thin film forming apparatus according to a first embodiment of the present invention.
Figure 4:
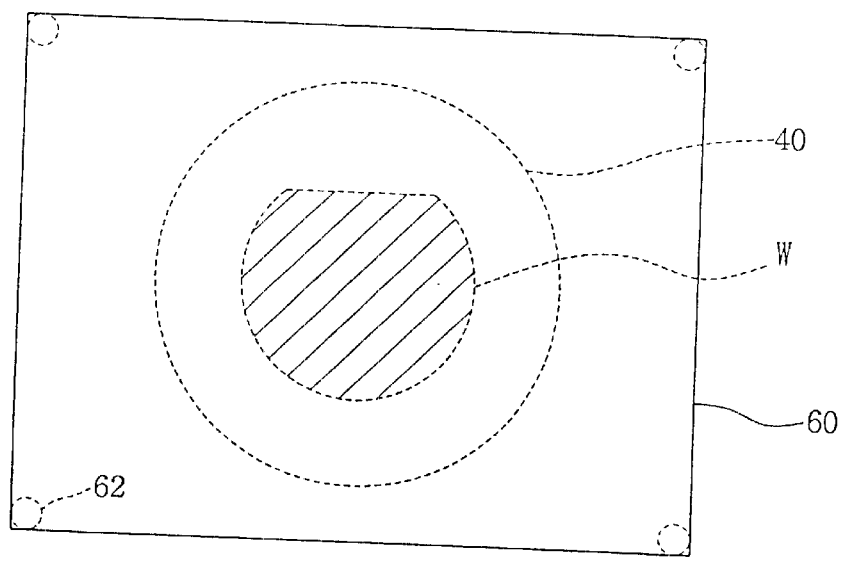

The reflecting apparatus 44 includes a reflector 46 for reflecting the thermal energy radiated from the heating apparatus toward the wafer (W) and a supporter 48 for supporting the reflector 46. In one embodiment, the reflector 46 has a flat planar mirror facing the wafer (W). At a minimum, the area of the reflector mirror facing the wafer-load region 43 is equal to that of the wafer. Preferably, the area of the planar mirror is larger than the wafer. Since the s wafer has a circular shape, the planar mirror is preferably a circular shape as well as shown in FIG. 3, with the supporters 48 disposed 180 degrees apart as shown. Alternatively, a rectangular shaped mirror having a wider coverage area than the wafer may also be employed, like the reflector 60 of the reflecting apparatus shown in FIG. 4. In this case, the supporters 62 may be disposed at the four edges of the reflector 60, respectively. However, only two supporters 62 may be used instead.

Figure 5:
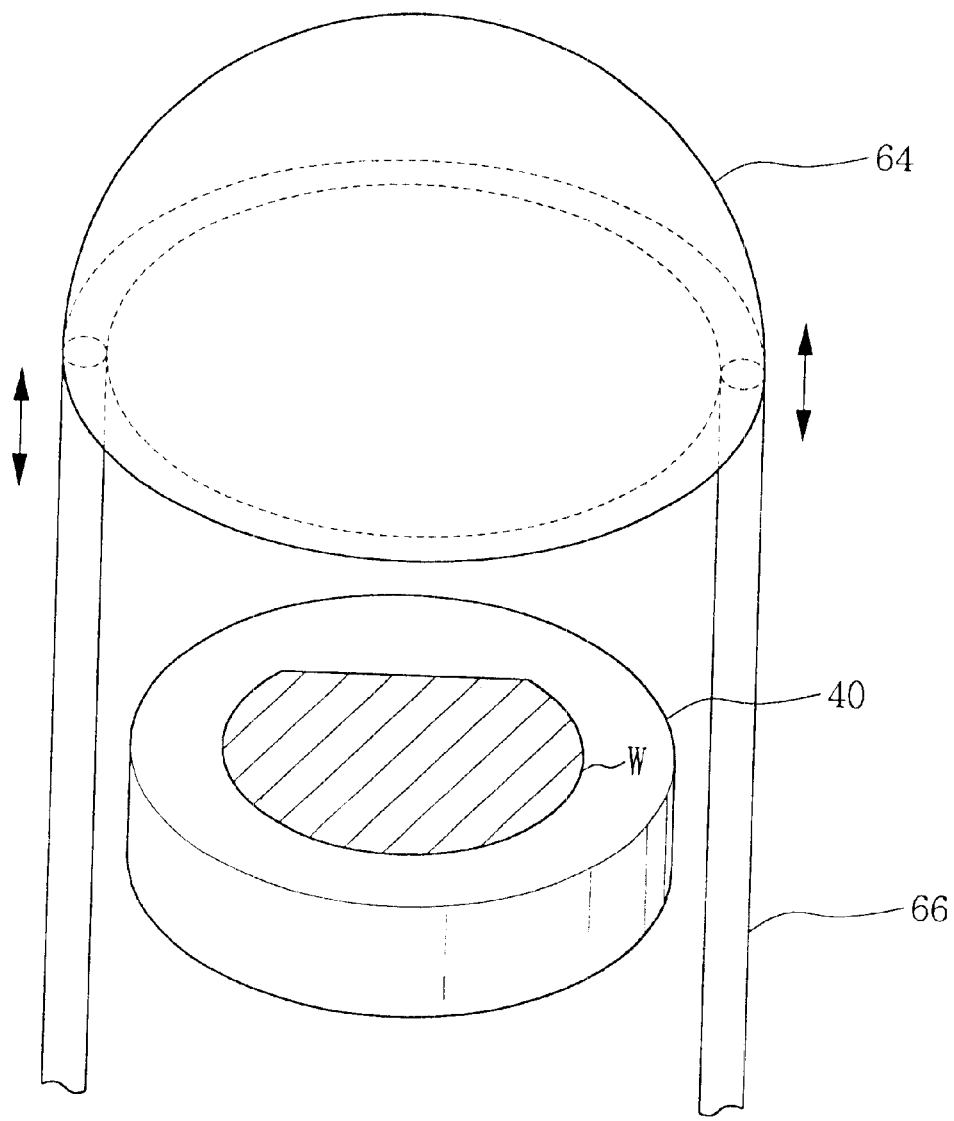
FIG. 5 is a perspective view of a reflecting apparatus having a semi-spherical type of reflector.

Also, rather than employing a planar mirror as in FIG. 2, it is preferable that the reflecting surface of the mirror be concave 64 as shown in FIG. 5, taking into consideration the heat island formed in the wafer-load region 43 and the reflection efficiency of the concave mirror 64. The reflecting surface of the concave mirror 64 facing the heating apparatus 40 thus exhibits a semi-spherical shape. As before, it is preferable that the area of the concave mirror 64 be larger than that of the wafer. As shown in FIG. 5, two opposite supporters 66 are connected to the two edges of the reflector 64, respectively. Only two supporters 66 may be used to support the reflector 64 and enable it to move up and down, but three or more supporters may also be provided for more stabilization in the movement. The supporters 66 may also include two cylinders, which are identical to the first and second cylinders 48a, 48b comprising supporters 48 as shown in FIG. 2, and described further below.

The supporters 48 are positioned around the heating apparatus 40. The number of the supporters 48 is determined according to the shape of the reflector 46 and the desired stability of movement. Keeping the supporters 48 to a minimum reduces the likelihood that the flow of source gas toward the wafer would be obstructed.

In this embodiment, the supporters 48 are comprised of first and second cylinders 48a, 48b. The first cylinder 48a is connected through the chamber 38 to the driver 50 beneath the chamber 38. The connection through the chamber is tightly sealed to maintain the proper pressure in the chamber without leakage. The first cylinder 48a acts as a guide for second cylinder 48b, which slides within first cylinder 48a. One side of the second cylinder 48b is connected to the driver 50 via the first cylinder 48a to receive the driving power generated by the driver 50, and the other side of the second cylinder 48b is connected to an edge of the reflector 46. Accordingly, under action of the driver 50, the reflector 46 can move up and down while facing the wafer-load region 43.

The reflector 46 can be located at an appropriate position between the shower head 52 and the wafer (W) during the formation of the thin film material (for example, an insulating layer or conductive layer) on the wafer, as indicated by the elevated position in FIG. 2. Since the pressure in the chamber 38 is very low, in the range of $0-10^{-7}$ torr during the formation of the thin film, the source gas ejected from the shower head 52 can easily reach the wafer (W) without any disturbances, even though the reflector 46 is located between the shower head 52 and the wafer (W). However, if the distance between the reflector 46 and the wafer (W) is too small, the reflector 46 may affect the source gas supply.

In the annealing step after the formation of the thin film material, the reflector 46 is moved to a position lower than the position for the thin film formation step, as indicated with the dotted lines in FIG. 2, so that the distance between wafer (W) and the reflector 46 may be minimized as much as possible. With such a close distance between the reflector 46 and the wafer (W), the wafer temperature can be increased to a temperature necessary for the annealing, and be uniformly distributed along the surface of the wafer, without an additional heating process.

In either the thin film forming step or the annealing step, since the reflector 46 is located above the wafer-load region 43, particles (P) which fall off the chamber wall are prevented from being deposited on the wafer (W).

To complete the description of the embodiment of the present invention, an exhaust outlet 54 discharges by-products created during the formation of the thin film material, and the outlet 54 is connected to the pump 56, which is preferably a turbo pump, although other type of pumps may be used, to regulate the pressure condition or process condition in the chamber. Wafer inlet 57 allows the wafer (W) to be transferred into and out of the chamber 38 for processing.

<Second Embodiment>

In this second embodiment, the positions of the supporters and the driver are different from the first embodiment. Referring to FIG. 6, the driver 70 is located on top of the chamber 39, rather than under the chamber 38 as in the first embodiment. The reflecting apparatus 80 consists of the reflector 82 and the supporters 84, which function in a manner identical to the reflector 46 and supporters 48 in the first embodiment. The only difference is they move in an opposite direction to those in FIG. 2.

The supporter 84 includes the first cylinder 84a connected to the driver 70, and acts as a guide for second cylinder 84b, which is in turn connected to the reflector 82. The supporters 84 are positioned around the shower head 52. Preferably, the supporters 84 are arranged symmetrically around the shower head 52 so that there is an unobstructed flow of source gas ejected from the shower head 52 toward the wafer (W) to ensure a uniform distribution of the gas. The driver 70 functions the same as the driver 50 in FIG. 2. The reflector 82 may be planar or concave as in the first embodiment, and the variable spacing of the reflector and the wafer (W) should be the same as described in the first embodiment (i.e., a closer spacing for the annealing process than the thin film forming process).

As described above, the thin film forming apparatus according to the present invention includes a reflecting apparatus for reflecting thermal energy radiated from the susceptor toward the wafer, thereby preventing impurities from being deposited on the wafer during the formation of the thin film. In addition, the wafer temperature is increased to a higher and stabilized temperature for the annealing process without additional power being supplied to the heater. Both of these attributes contribute to the uniformity of the thin film material formed on the surface of the wafer.

The above description should not be construed as limited to the exact embodiments set forth. For example, by way of illustration and not limitation, one skilled in this field could provide a different support structure, or different types of drivers, or reflectors that incorporate horizontal as well as vertical movement, and still be considered within the scope of the invention as set forth in the appended claims.

What is claimed is:

1. A wafer treatment apparatus, comprising:

a chamber;

a wafer heating apparatus disposed within the chamber, the wafer heating apparatus having a wafer-load region configured to support a wafer;

a shower head disposed within the chamber at a position opposing the wafer-load region;

a thermal reflector located between the shower head and the wafer-load region of the wafer heating apparatus, wherein the thermal reflector is configured to reflect thermal energy which emanates from the wafer heating apparatus back towards the wafer-load region of the wafer heating apparatus; and a pump which is connected to the chamber and which regulates a pressure within the chamber.

2. The apparatus as claimed in claim 1, wherein the thermal reflector comprises:

a reflector body having a thermally reflective surface which faces towards the wafer-load region; and a support which supports the reflector body between the shower head and the wafer-load region.

3. The apparatus as claimed in claim 2, wherein the thermally reflective surface is planar.

4. The apparatus as claimed in claim 2, wherein the thermally reflective surface is concave.

5. The apparatus as claimed in claim 4, wherein the thermally reflective surface is semi-spherical.

6. The apparatus as claimed in claim 2, wherein the reflector body is movable in a first direction towards the wafer-load region and in an opposite second direction away from the wafer-load region.

7. The apparatus as claimed in claim 6, further comprising a drive mechanism which is operatively coupled to the reflector body to move the reflector body in the first and second directions.

8. The apparatus as claimed in claim 7, wherein the drive mechanism is located below and outside the chamber.

9. The apparatus as claimed in claim 8, wherein the support comprises first and second cylinders which are concentric to one another, and wherein the first cylinder is connected to the reflector body and is responsive to the drive mechanism to reciprocate in the first and second directions within the second cylinder.

10. The apparatus as claimed in claim 7, wherein the drive mechanism is located above and outside the chamber.

11. The apparatus as claimed in claim 10, wherein the support comprises first and second cylinders which are concentric to one another, and wherein the first cylinder is connected to the reflector body and is responsive to the drive mechanism to reciprocate in the first and second directions within the second cylinder.

12. The apparatus as claimed in claim 7, wherein the support comprises first and second cylinders which are concentric to one another, and wherein the first cylinder is connected to the reflector body and is responsive to the drive mechanism to reciprocate in the first and second directions within the second cylinder.

13. The apparatus as claimed in claim 2, wherein the support is symmetrically disposed about the wafer-load region of the wafer heating apparatus.

14. The apparatus as claimed in claim 1, wherein said heating apparatus comprises a susceptor defining said wafer-load region, and a heater disposed in an upper portion of said susceptor.

15. The apparatus as claimed in claim 14, wherein said heater includes a plurality of heater blocks.

* * * * *